US009238578B2

(12) United States Patent  
Cheng et al.

(10) Patent No.: US 9,238,578 B2  
(45) Date of Patent: *Jan. 19, 2016

(54) SEMICONDUCTOR ARRANGEMENT WITH STRESS RELEASE AND THERMAL INSULATION

(71) Applicant: Taiwan Semiconductor Manufacturing Company Limited, Hsin-Chu (TW)

(72) Inventors: Chun-Wen Cheng, Zhubei (TW); Chia-Hua Chu, Zhubei (TW); Yi-Chuan Teng, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,101

(22) Filed: Mar. 7, 2014

(65) Prior Publication Data

US 2015/0251901 A1     Sep. 10, 2015

(51) Int. Cl.  
*H01L 21/00*         (2006.01)  
*B81B 7/00*          (2006.01)  
*B81C 1/00*          (2006.01)

(52) U.S. Cl.  
CPC ........... *B81B 7/0054* (2013.01); *B81C 1/00325* (2013.01); *B81B 7/008* (2013.01); *B81C 1/00269* (2013.01)

(58) Field of Classification Search  
USPC ......................................................... 438/50  
See application file for complete search history.

(56) References Cited

U.S. PATENT DOCUMENTS

| 2005/0036269 | A1* | 2/2005 | Ma | B81B 7/0077 361/301.1 |
| 2009/0267166 | A1* | 10/2009 | Verheijden et al. | B81C 1/00476 257/415 |
| 2010/0251818 | A1* | 10/2010 | Ge | G01C 19/5684 73/504.12 |
| 2012/0313235 | A1* | 12/2012 | Chu | B81B 3/0005 257/692 |
| 2012/0326248 | A1* | 12/2012 | Daneman | B81B 7/02 257/415 |
| 2013/0168852 | A1* | 7/2013 | Liang | B81C 1/00293 257/737 |

* cited by examiner

*Primary Examiner* — Asok K Sarkar  
(74) *Attorney, Agent, or Firm* — Cooper Legal Group, LLC

(57) ABSTRACT

Among other things, one or more semiconductor arrangements and techniques for forming such semiconductor arrangements are provided herein. A semiconductor arrangement comprises a cap wafer, a microelectromechanical systems (MEMS) wafer, and a complementary metal-oxide-semiconductor (CMOS) wafer. The cap wafer comprises one or more spring structures, such as a first spring structure and a second spring structure. The first spring structure and the second spring structure relieve stress as portions of the semiconductor arrangement, such as a membrane and a poly layer, move. An ambient pressure chamber is formed between the CMOS wafer and the MEMS wafer, such as for CMOS outgassing relief. One or more thermal insulator structures are formed between the CMOS wafer and the MEMS wafer to protect the MEMS wafer from heat originating from the CMOS wafer.

20 Claims, 19 Drawing Sheets

SEMICONDUCTOR ARRANGEMENT WITH STRESS RELEASE AND THERMAL INSULATION

BACKGROUND

Complementary metal-oxide-semiconductor (CMOS) is a technology used in constructing integrated circuits, such as image sensors, data converters, communication modules, etc. Many integrated circuits or semiconductor arrangements thus comprise CMOS wafers or at least one or more portions of a wafer whereon CMOS technology is implemented. Heat from a CMOS wafer, such as from outgassing, can damage other portions of a semiconductor arrangement. A semiconductor arrangement can also be damaged from stress, such as printed circuit board stress. For example, stress-induced solder joint failure can occur from such stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
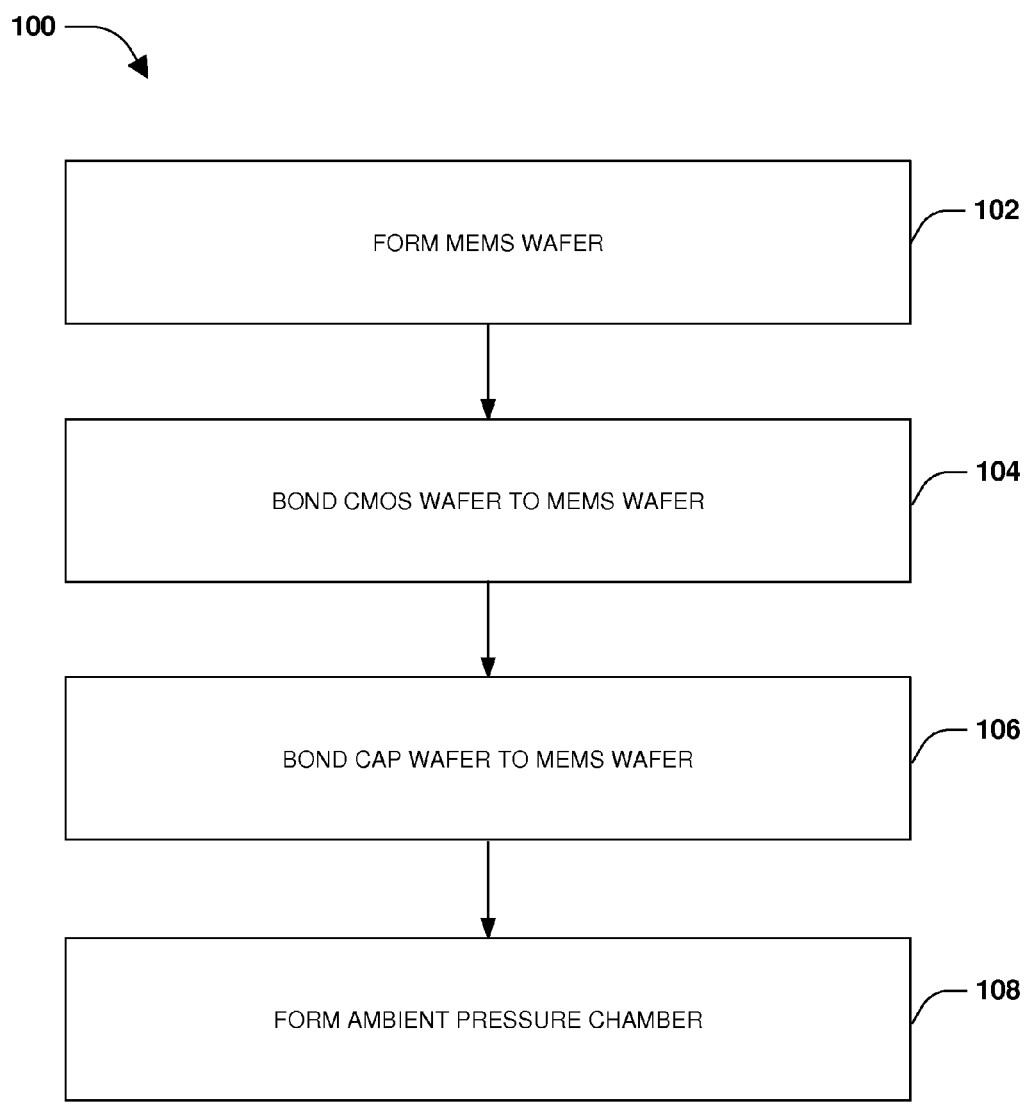
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and techniques for forming such semiconductor arrangements are provided. In some embodiments, a semiconductor arrangement comprises a complementary metal-oxide-semiconductor (CMOS) wafer. A microelectromechanical systems (MEMS) wafer is formed over the CMOS wafer. The MEMS wafer comprises a high vacuum chamber configured as a sensing gap between a membrane of the MEMS wafer and a poly layer of the MEMS wafer. A cap wafer is formed over the MEMS wafer. An ambient pressure chamber is formed between the MEMS wafer and the cap wafer. In some embodiments a thermal insulator is formed between the MEMS wafer and the CMOS wafer to insulate the MEMS wafer from heat originating from the CMOS wafer, which can otherwise damage the MEMS wafer. In some embodiments, the sensing gap is configured to deform based upon movement of the membrane with respect to the poly layer. One or more spring structures, such as a membrane spring structure formed within the cap layer, are configured to relieve stress based upon deformation of the sensing gap. In this way, CMOS outgassing, stress, and thermal damage are mitigated for the semiconductor arrangement.

Figure 2:
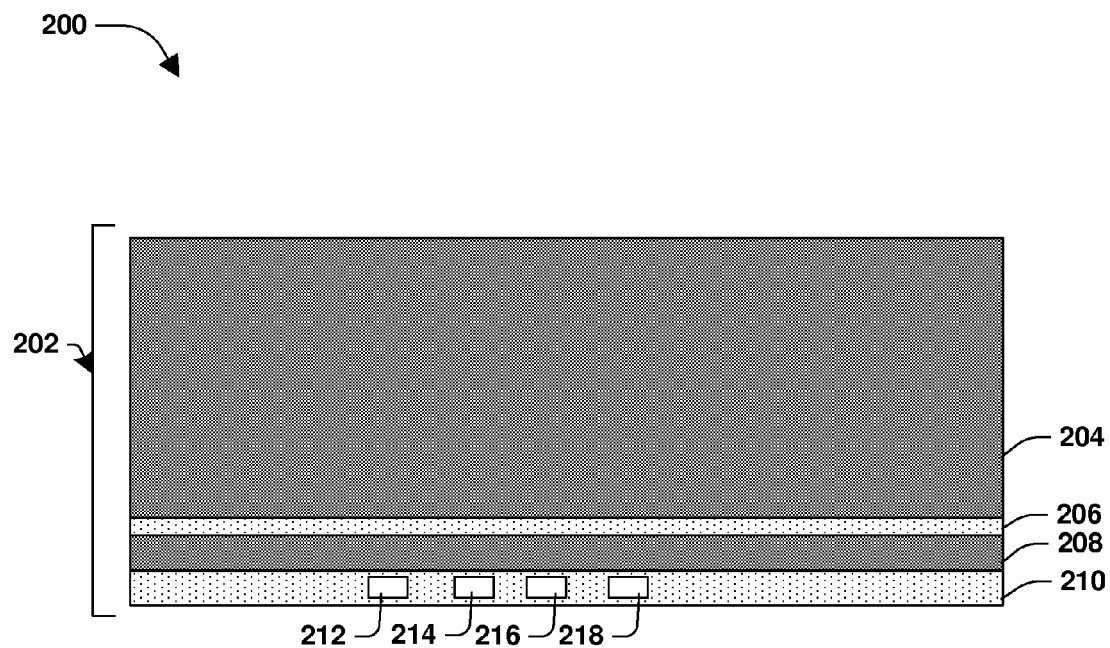
FIG. 2 is an illustration of a semiconductor arrangement comprising a microelectromechanical systems (MEMS) wafer, in accordance with some embodiments.

A method 100 of forming a semiconductor arrangement is illustrated in FIG. 1, and one or more semiconductor arrangements formed by such a methodology are illustrated in FIGS. 2-15D. At 102, a MEMS wafer 202 of a semiconductor arrangement 200 is formed, as illustrated in FIG. 2. In some embodiments, a silicon-on-insulator (SOI) wafer comprising a first silicon layer 204, a first oxide layer 206, and a second silicon layer 208 is used to form the MEMS wafer 202, as illustrated in FIG. 2. A second oxide layer 210 is deposited on the on the second silicon layer 208. In some embodiments, oxide seam trench formation is performed to form one or more trenches, such as a first trench 212, a second trench 214, a third trench 216, a fourth trench 218, or other trenches, into the second oxide layer 210.

Figure 3:
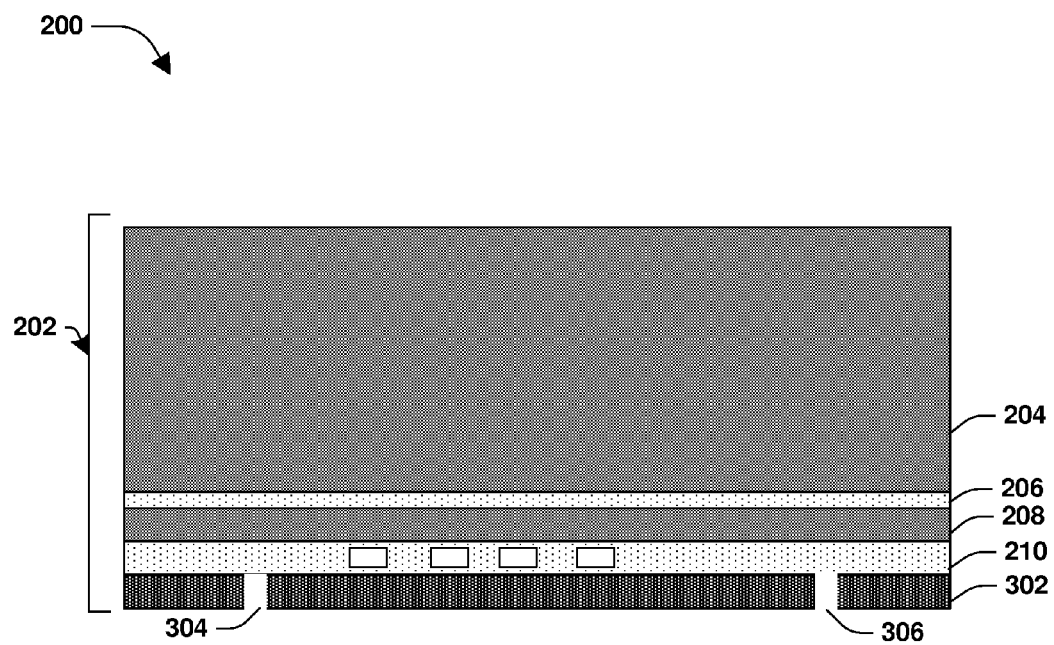
FIG. 3 is an illustration of a semiconductor arrangement comprising a microelectromechanical systems (MEMS) wafer, in accordance with some embodiments.

A poly layer 302 is formed on the second oxide layer 210 of the MEMS wafer 202, as illustrated in FIG. 3. In some embodiments, the poly layer 302 is formed by a deposition process. In some embodiments, the poly layer 302 has a thickness between about a sub-micrometer thickness to about a several micrometer thickness. In some embodiments, chemical mechanical polishing (CMP) is performed on the poly layer 302. In some embodiments, the poly layer 302 is patterned to form one or more trenches, such as a first trench 304, a second trench 306, or other trenches.

Figure 4:
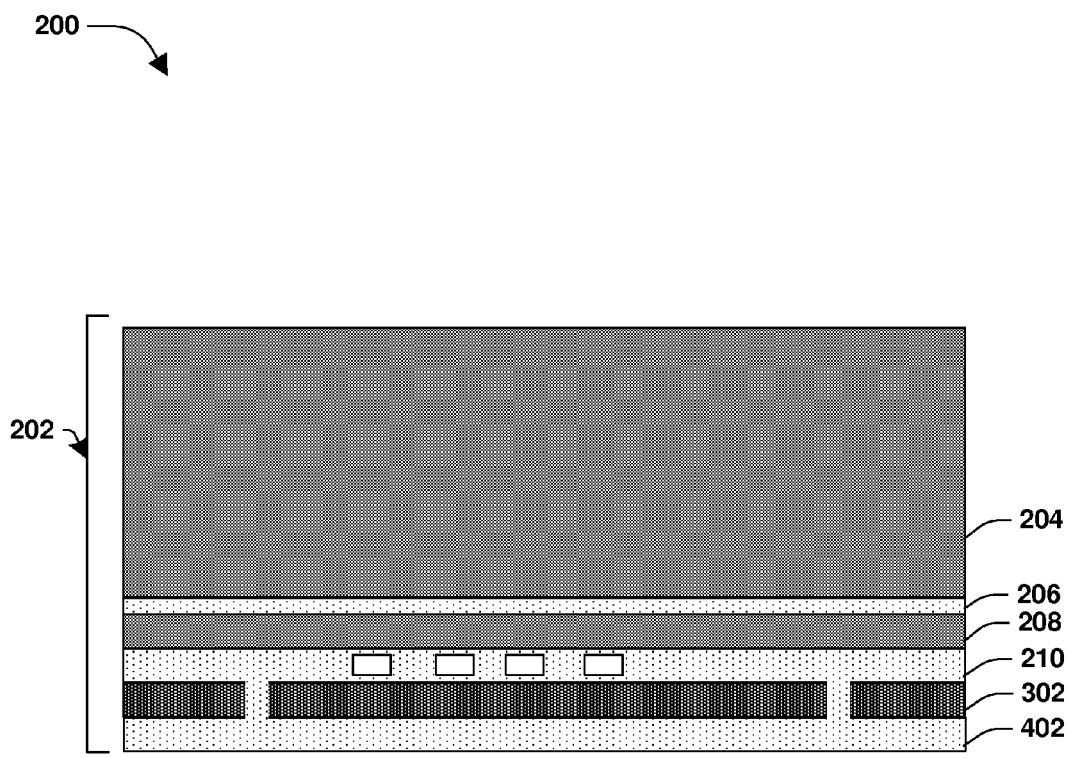
FIG. 4 is an illustration of a semiconductor arrangement comprising a microelectromechanical systems (MEMS) wafer, in accordance with some embodiments.

A third oxide layer 402 is formed on the poly layer 302, as illustrated in FIG. 4. In some embodiments, the third oxide layer 402 is formed by an oxide deposition process. In some embodiments, an annealing process is performed after the oxide deposition process. In some embodiments, the oxide deposition process fills the first trench 304 and the second trench 306 with oxide.

Figure 5:
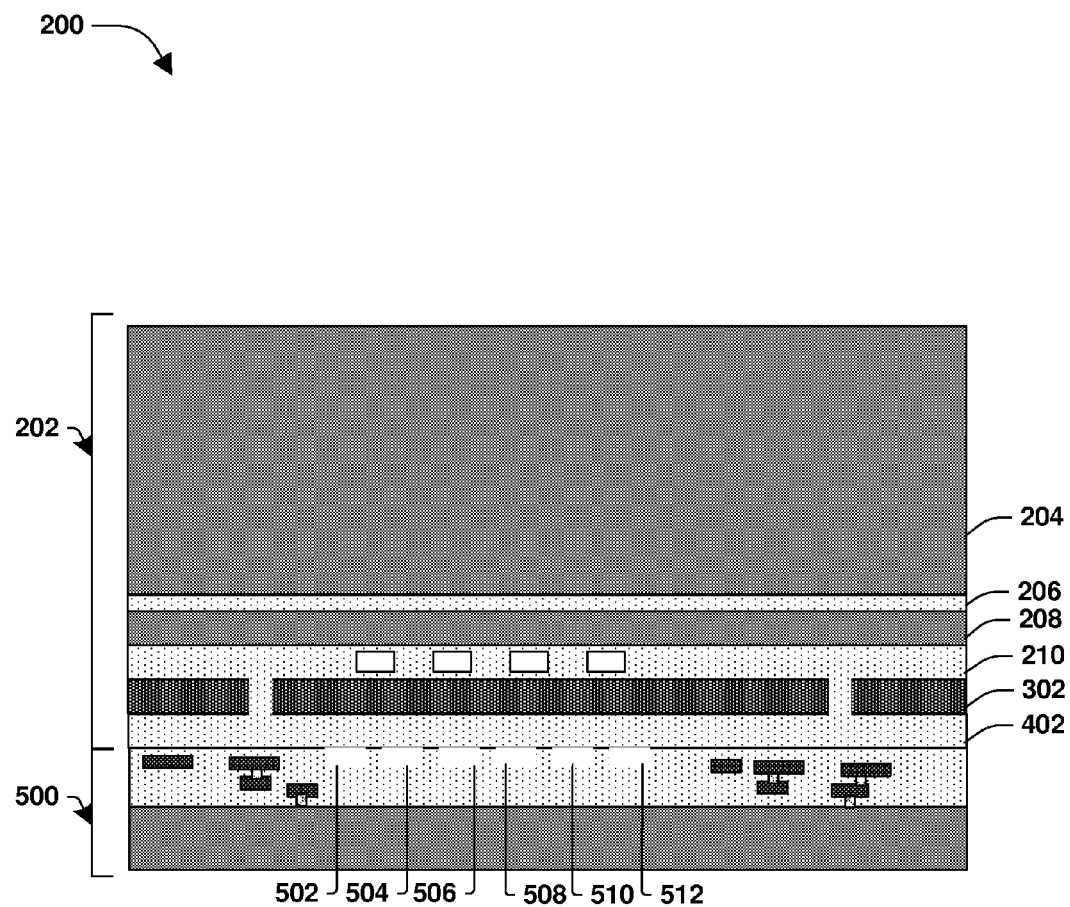
FIG. 5 is an illustration of a semiconductor arrangement comprising a microelectromechanical systems (MEMS) wafer bonded to a complementary metal-oxide-semiconductor (CMOS) wafer, in accordance with some embodiments.

At 104, a CMOS wafer 500 is bonded to the MEMS wafer 202, as illustrated in FIG. 5. In some embodiments, a fusion bonding technique is performed to fuse the CMOS wafer 500 to the MEMS wafer 202. In some embodiments, the one or more thermal insulation structures, such as a first thermal insulation structure 502, a second thermal insulation structure 504, a third thermal insulation structure 506, a fourth thermal insulation structure 508, a fifth thermal insulation structure 510, and a sixth thermal insulation structure 512, are formed between the CMOS wafer 500 and the MEMS wafer 202. The one or more thermal insulators protect portions of the semiconductor arrangement 200, such as the MEMS wafer 202, from heat generated by the CMOS wafer 500.

Figure 6:
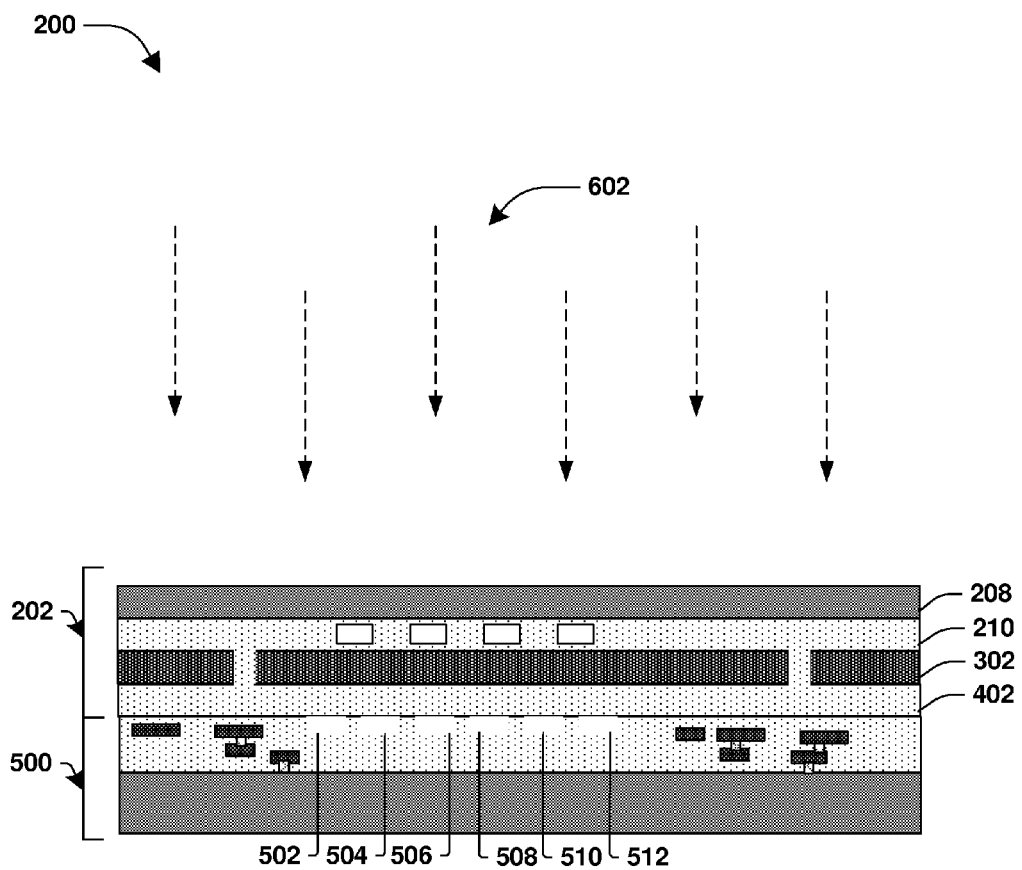
FIG. 6 is an illustration of a semiconductor arrangement comprising a microelectromechanical systems (MEMS) wafer bonded to a complementary metal-oxide-semiconductor (CMOS) wafer, in accordance with some embodiments.

The first silicon layer 204 is removed 602 from the MEMS wafer 202, as illustrated in FIG. 6. In some embodiments, a silicon etch is performed to remove the first silicon layer 204, which stops at the first oxide layer 206. In some embodiments, the first oxide layer 206 is removed from the MEMS wafer 202 after the first silicon layer 204 is removed.

Figure 7:
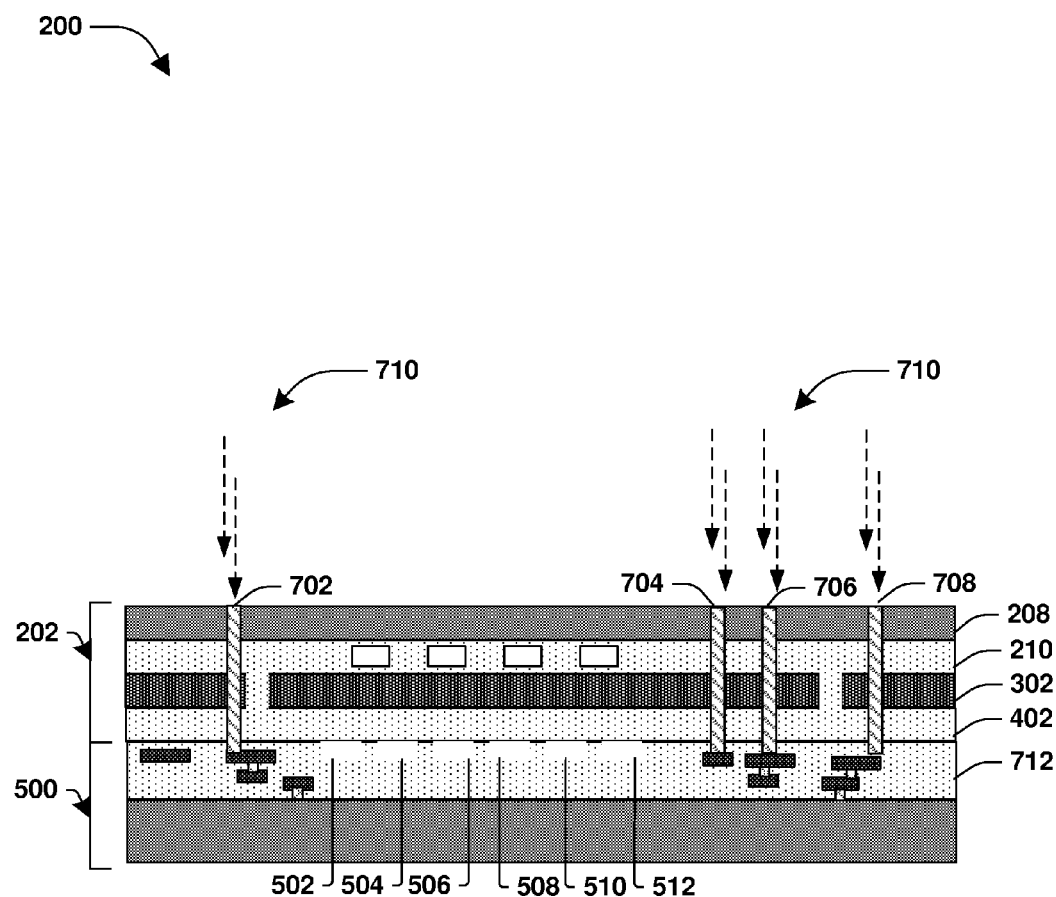
FIG. 7 is an illustration of a semiconductor arrangement comprising a microelectromechanical systems (MEMS) wafer bonded to a complementary metal-oxide-semiconductor (CMOS) wafer, in accordance with some embodiments.

An etching process 710 is performed to form one or more trenches, such as a first trench, a second trench, a third trench, and a fourth trench, through the MEMS wafer 202, as illustrated in FIG. 7. In some embodiments, the etching process 710 etches a portion of an oxide layer 712 of the CMOS wafer 500. In some embodiments, the etching process 710 comprises a deep reactive-ion etching process. A conductive material, such as tungsten or another metal, is formed within the first trench to form a first tungsten plug 702, within the second trench to form a second tungsten plug 704, within the third trench to form a third tungsten plug 706, and within the fourth trench to form a fourth tungsten plug 706. The tungsten plugs are used as connections through the MEMS wafer 202 to the CMOS wafer 500.

Figure 8:
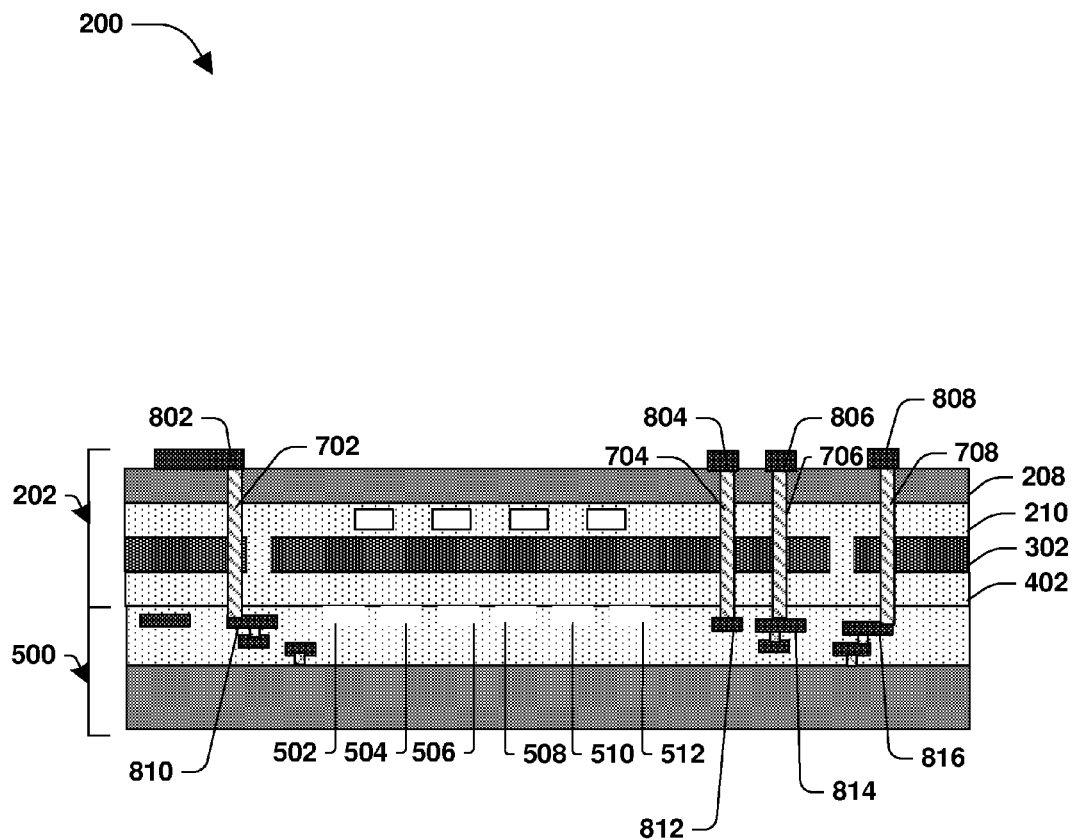
FIG. 8 is an illustration of a semiconductor arrangement comprising a microelectromechanical systems (MEMS) wafer bonded to a complementary metal-oxide-semiconductor (CMOS) wafer, in accordance with some embodiments.

One or more metal structures, such as a first metal structure 802, a second metal structure 804, a third metal structure 806, a fourth metal structure 808, or other metal structures, are formed on the MEMS wafer 202, as illustrated in FIG. 8. In some embodiments, the one or more metal structures are formed by a patterning process. In some embodiments, the one or more metal structures comprise a metal such as aluminum. The first metal structure 802 provides connectivity to the CMOS wafer 500 through the first tungsten plug 702 to a first CMOS metal structure 810. The second metal structure 804 provides connectivity to the CMOS wafer 500 through the second tungsten plug 704 to a second CMOS metal structure 812. The third metal structure 806 provides connectivity to the CMOS wafer 500 through the third tungsten plug 706 to a third CMOS metal structure 814. The fourth metal structure 808 provides connectivity to the CMOS wafer 500 through the fourth tungsten plug 708 to a fourth CMOS metal structure 816.

Figure 9:
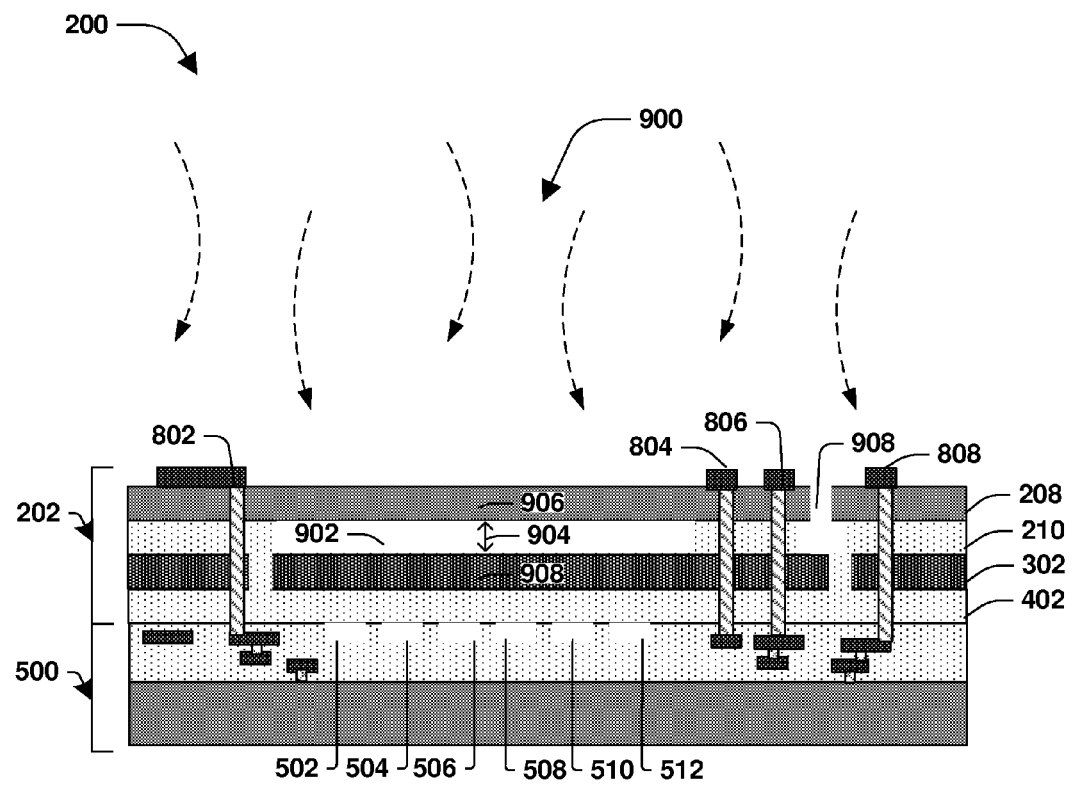
FIG. 9 is an illustration of a semiconductor arrangement comprising a microelectromechanical systems (MEMS) wafer bonded to a complementary metal-oxide-semiconductor (CMOS) wafer, in accordance with some embodiments.

An opening 908 is formed through the second silicon layer 208, such as by a via etching process, to access the second oxide layer 210, as illustrated in FIG. 9. An etching process 900, such as a vapor hydrogen fluoride (VHF) release, a dry etch, or acid etch, is performed to remove a portion of the second oxide layer 210 to form a high vacuum chamber 902. A portion of the poly layer 302, such as a poly layer 908, is formed between the third oxide layer 402 and the high vacuum chamber 902. A portion of the second silicon layer 208 is formed as a membrane 906 over the high vacuum chamber 902. In this way, the high vacuum chamber 902 is positioned between the membrane 904 and the poly layer 908, such that the membrane 904 can move with respect to the poly layer 908. The high vacuum chamber 902 is configured as a sensing gap 904. In some embodiments, the sensing gap 904 is configured to deform based upon movement of the membrane 906 with respect to the poly layer 908. In some embodiments, a first sensing plate is coupled to the membrane 906 and the second sensing plate is coupled to the poly layer 908. The first sensing plate and the second sensing plate are configured to provide capacitance information used to determine deformation of the sensing gap 904.

Figure 10:
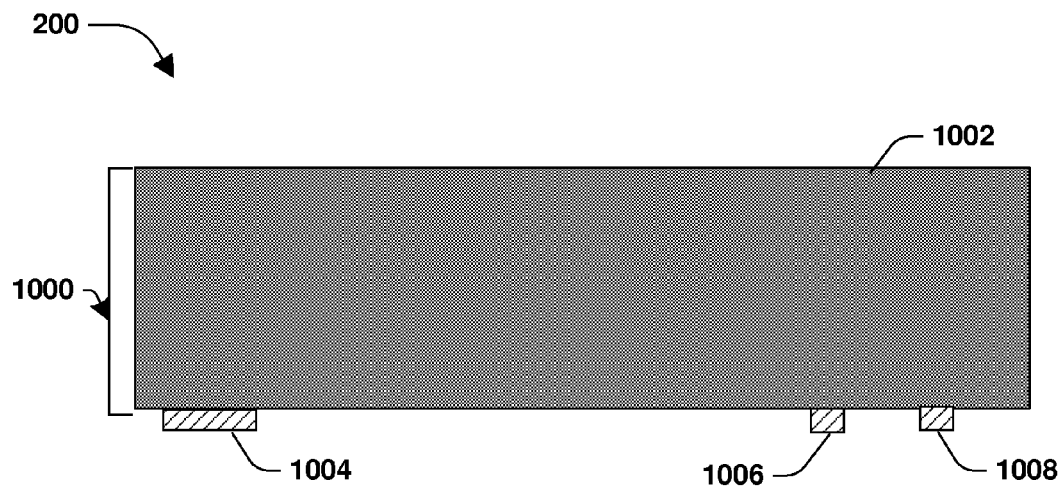
FIG. 10 is an illustration of a semiconductor arrangement comprising a microelectromechanical systems (MEMS) wafer bonded to a complementary metal-oxide-semiconductor (CMOS) wafer, and comprising a cap wafer, in accordance with some embodiments.
Figure 10:
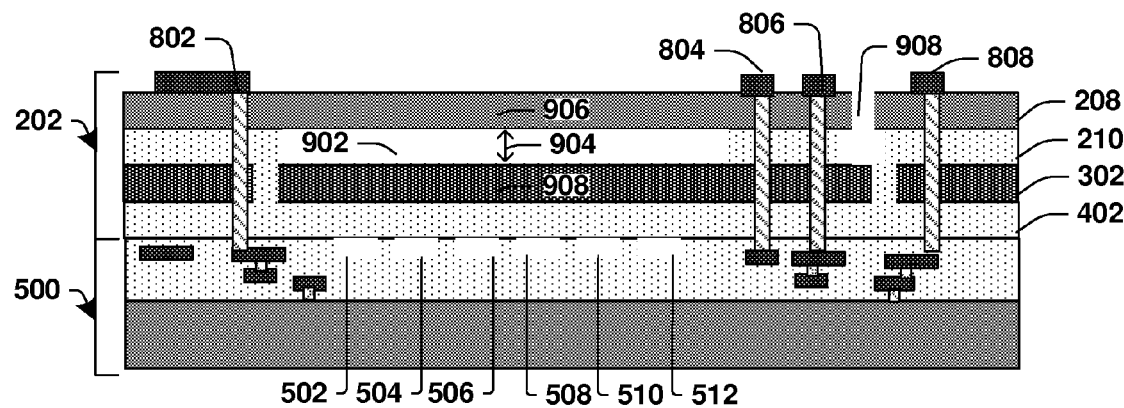

A cap wafer 1000 comprises one or more bonding structures, such as a first bonding structure 1004, a second bonding structure 1006, and a third bonding structure 1008, which are used to bond the cap wafer 1000 to the MEMS wafer 202, as illustrated in FIG. 10. The cap wafer 1000 comprises a silicon layer 1002 on which the one or more bonding structures are formed.

Figure 11:
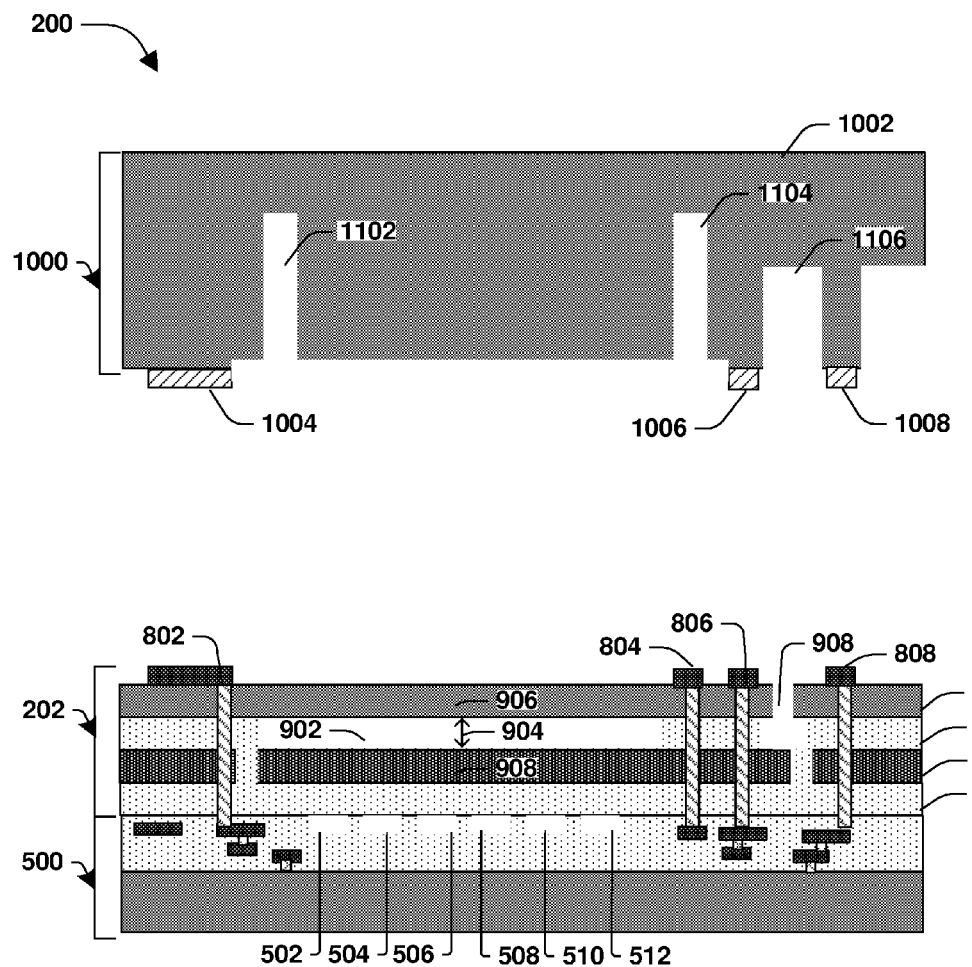
FIG. 11 is an illustration of a semiconductor arrangement comprising a microelectromechanical systems (MEMS) wafer bonded to a complementary metal-oxide-semiconductor (CMOS) wafer, and comprising a cap wafer, in accordance with some embodiments.

A first cavity etch, such as a high aspect ratio etch, is performed to form a first cavity 1102, a second cavity 1104, or other cavities into the silicon layer 1002, as illustrated in FIG. 11. A second cavity etch is performed to form a third cavity 1106 or other cavities into the silicon layer 1002. In some embodiments, the first cavity 1102 and the second cavity 1106 are formed deeper into the silicon layer 1002 than the third cavity 1106.

Figure 12:
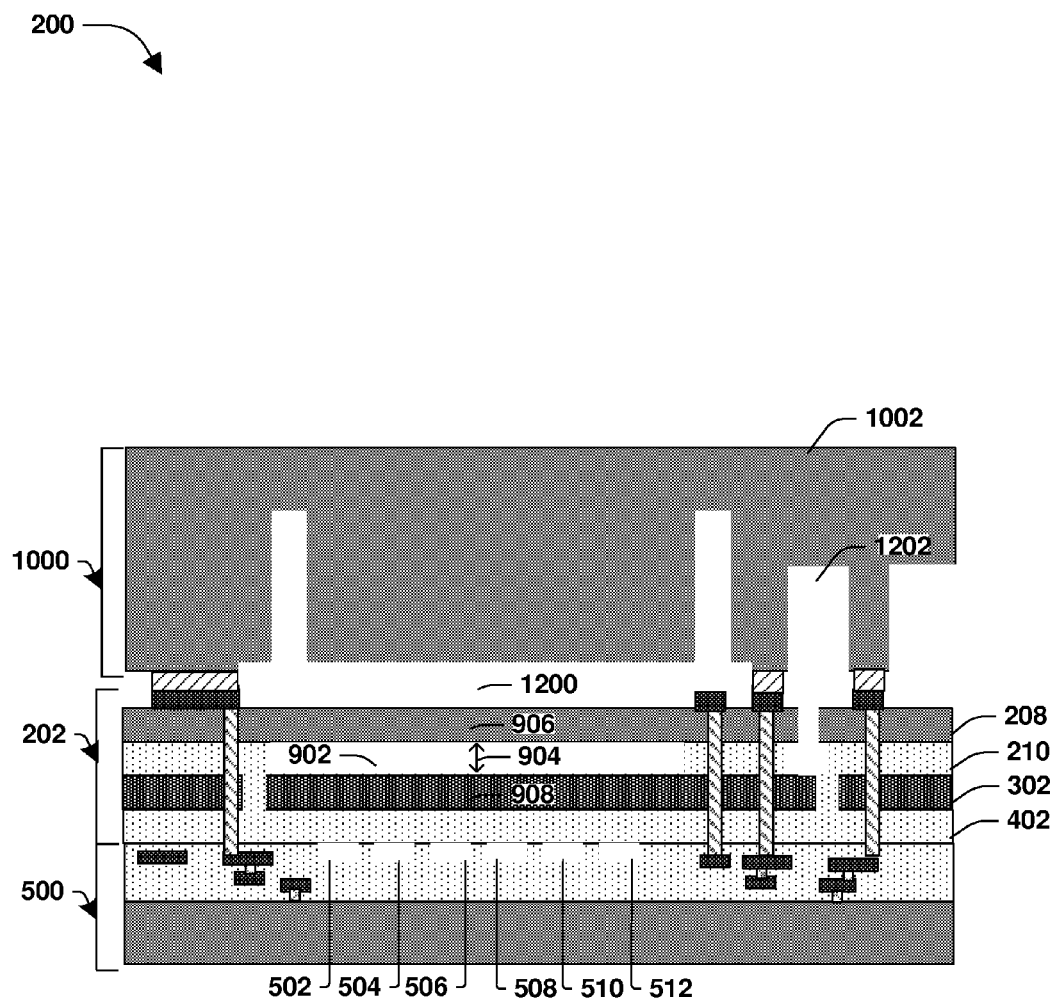
FIG. 12 is an illustration of a semiconductor arrangement comprising a microelectromechanical systems (MEMS) wafer bonded to a complementary metal-oxide-semiconductor (CMOS) wafer and to a cap wafer, in accordance with some embodiments.

At 106, the cap wafer 1000 is bonded to the MEMS wafer 202, as illustrated in FIG. 12. In some embodiments, a eutectic bonding process, utilizing pressure and temperature, is performed to bond the cap wafer 1000 to the MEMS wafer 202. The third cavity 1106 is formed as a vacuum chamber 1202. At 108, an ambient pressure chamber 1200 is formed between the MEMS wafer 202 and the cap wafer 1000. A pressure differences between the ambient pressure chamber 1200 and the high vacuum chamber 902 allows the membrane 906 to move with respect to the poly layer 908.

Figure 13:
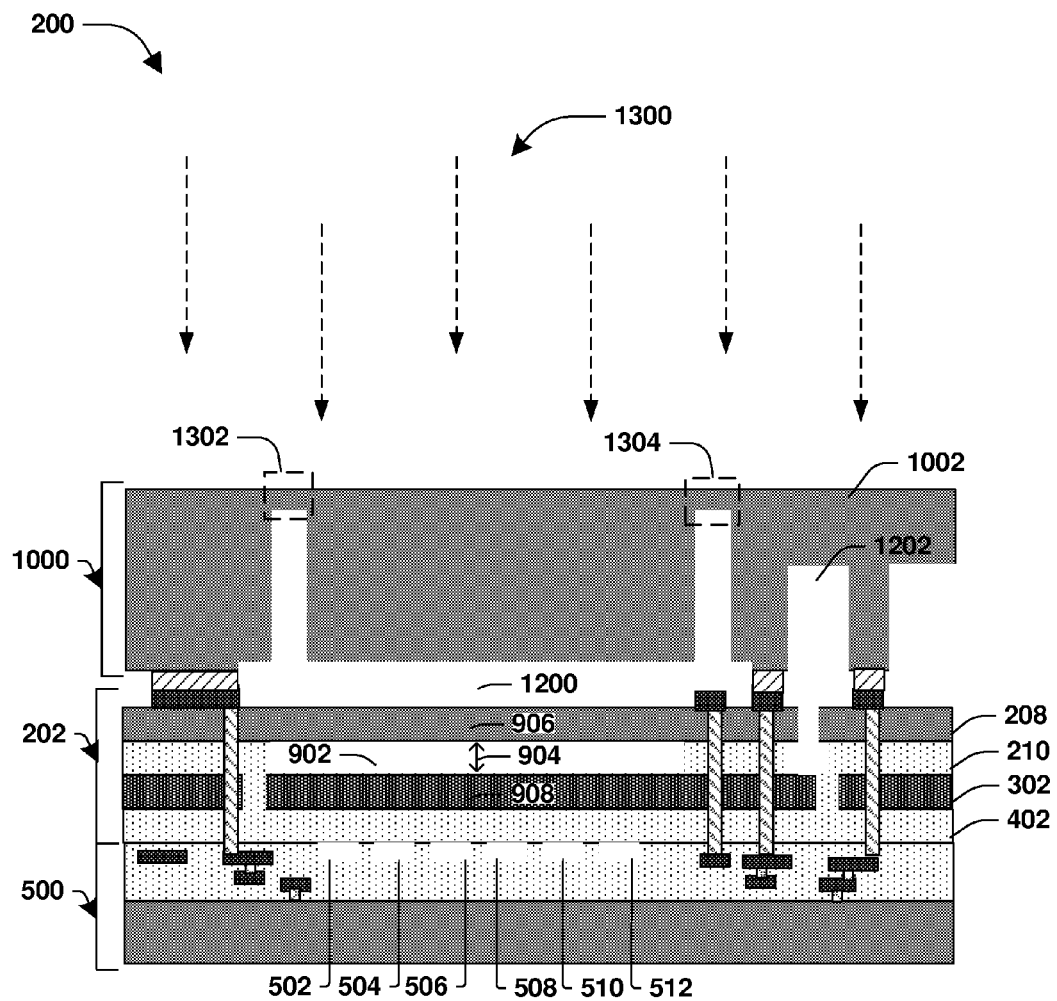
FIG. 13 is an illustration of a semiconductor arrangement comprising a microelectromechanical systems (MEMS) wafer bonded to a complementary metal-oxide-semiconductor (CMOS) wafer and to a cap wafer, in accordance with some embodiments.

One or more spring structures, such as a first membrane spring structure 1302 and a second membrane spring structure 1304, are formed from the silicon layer 1002 of the cap wafer 1000, as illustrated in FIG. 13. In some embodiments, at least one of a grinding process or an etching process is performed to remove 1300 a portion of the silicon layer 1002 to form the one or more spring structures. In some embodiments, the first membrane spring structure 1302 and the second membrane spring structure 1304 are formed between a top surface of the cap wafer 1000 and the ambient pressure chamber 1200. The first membrane spring structure 1302 and the second membrane spring structure 1304 provide stress release for the semiconductor arrangement 200, such as from movement of the membrane 906 with respect to the poly layer 908 that deforms the sensing gap 904.

Figure 14A:
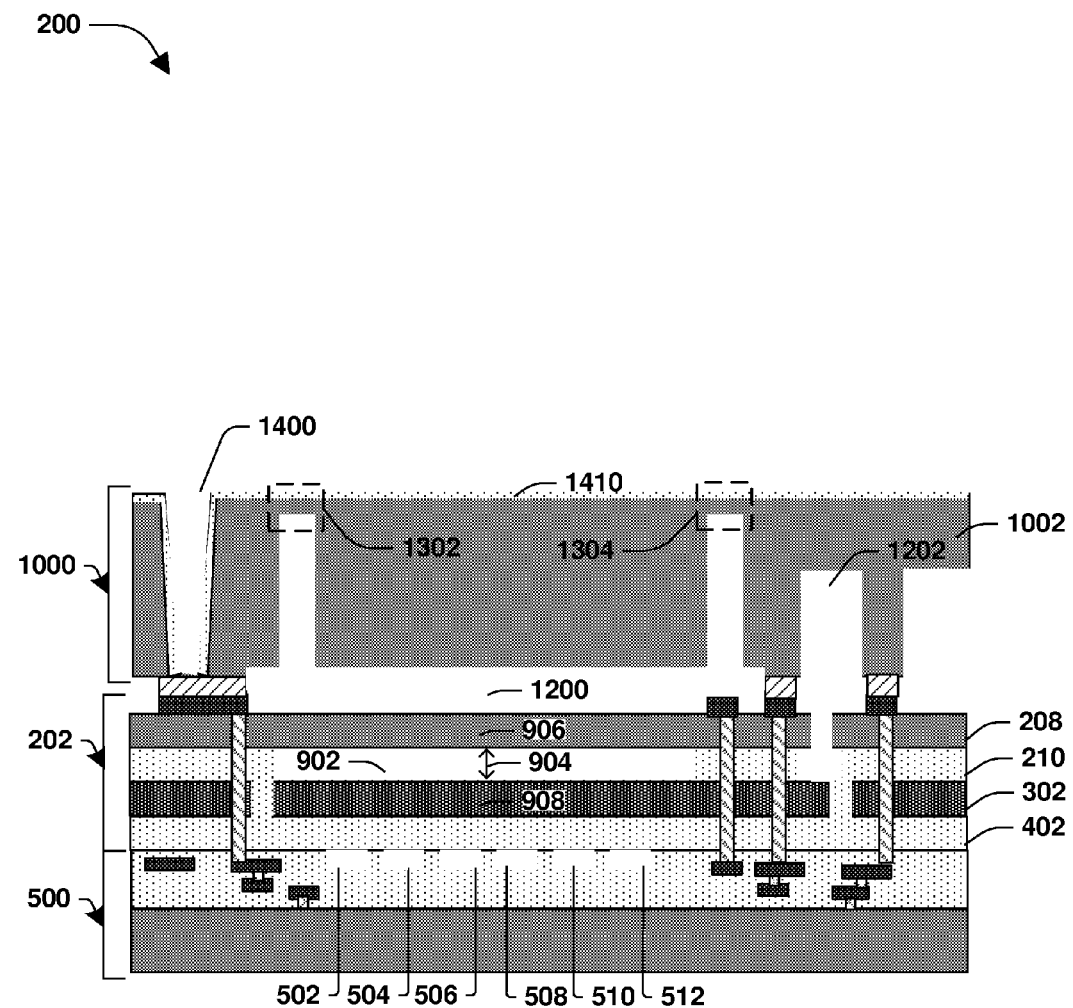
FIG. 14A is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 14B:
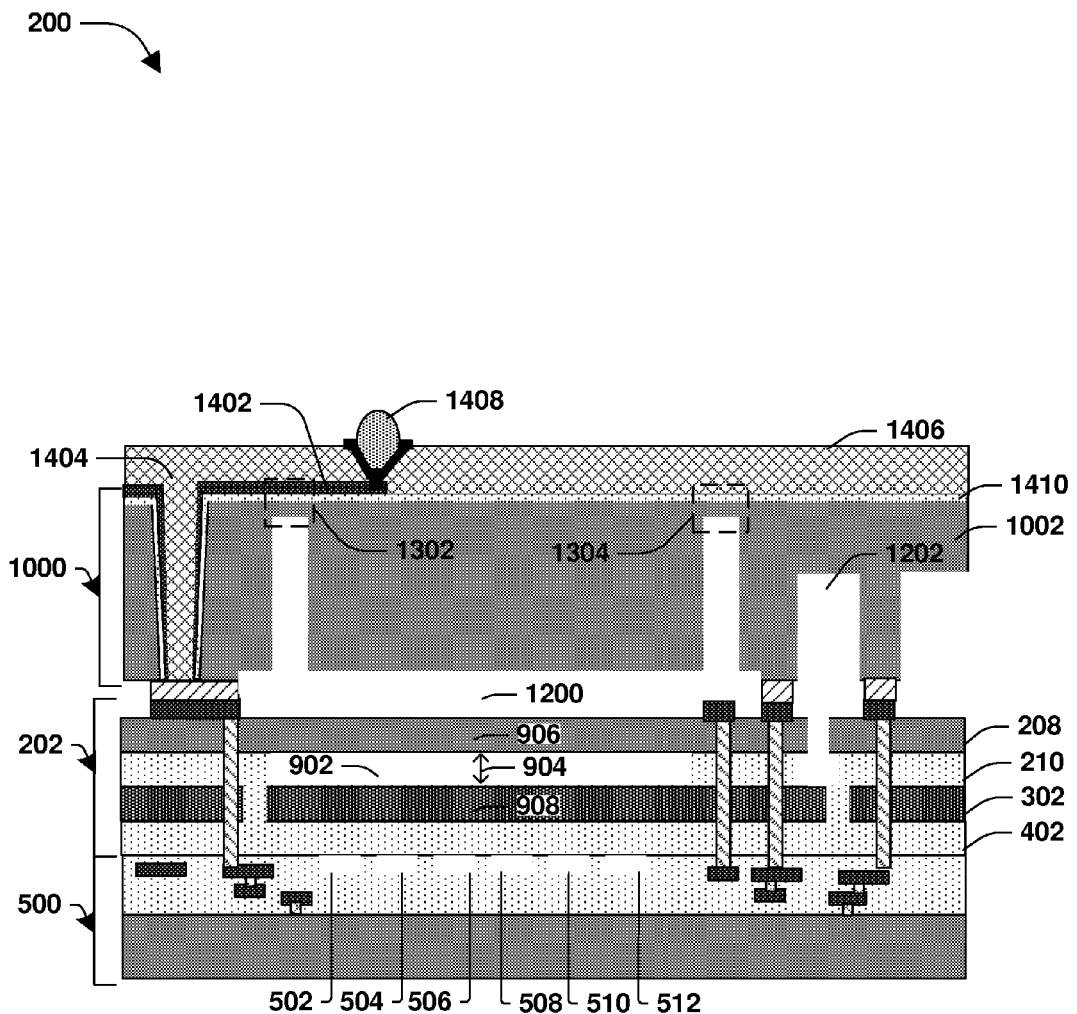
FIG. 14B is an illustration of a semiconductor arrangement comprising a microelectromechanical systems (MEMS) wafer bonded to a complementary metal-oxide-semiconductor (CMOS) wafer and to a cap wafer, in accordance with some embodiments.

In some embodiments, a portion of the silicon layer 1002 of the cap wafer 1000 is removed to form a trench 1400, as illustrated in FIG. 14A. In some embodiments, oxide 1410 is deposited over the trench 1400 and the silicon layer 1002. A through-silicon via (TSV) structure 1404 is formed within the trench 1400, as illustrated in FIG. 14B. In some embodiments, a metal 1402, such as aluminum, is sputtered over at least some of the oxide 1410 such as within the trench 1400. In some embodiments, the TSV structure 1404 is connected to a metal connection 1408, such as a solder ball. In some embodiments, a barrier layer 1406 is formed over the cap wafer 1000, such as over the oxide 1410 and within the TSV structure 1404. In some embodiments, the barrier layer 1406 comprises a polybenzoxazole material.

Figure 15A:
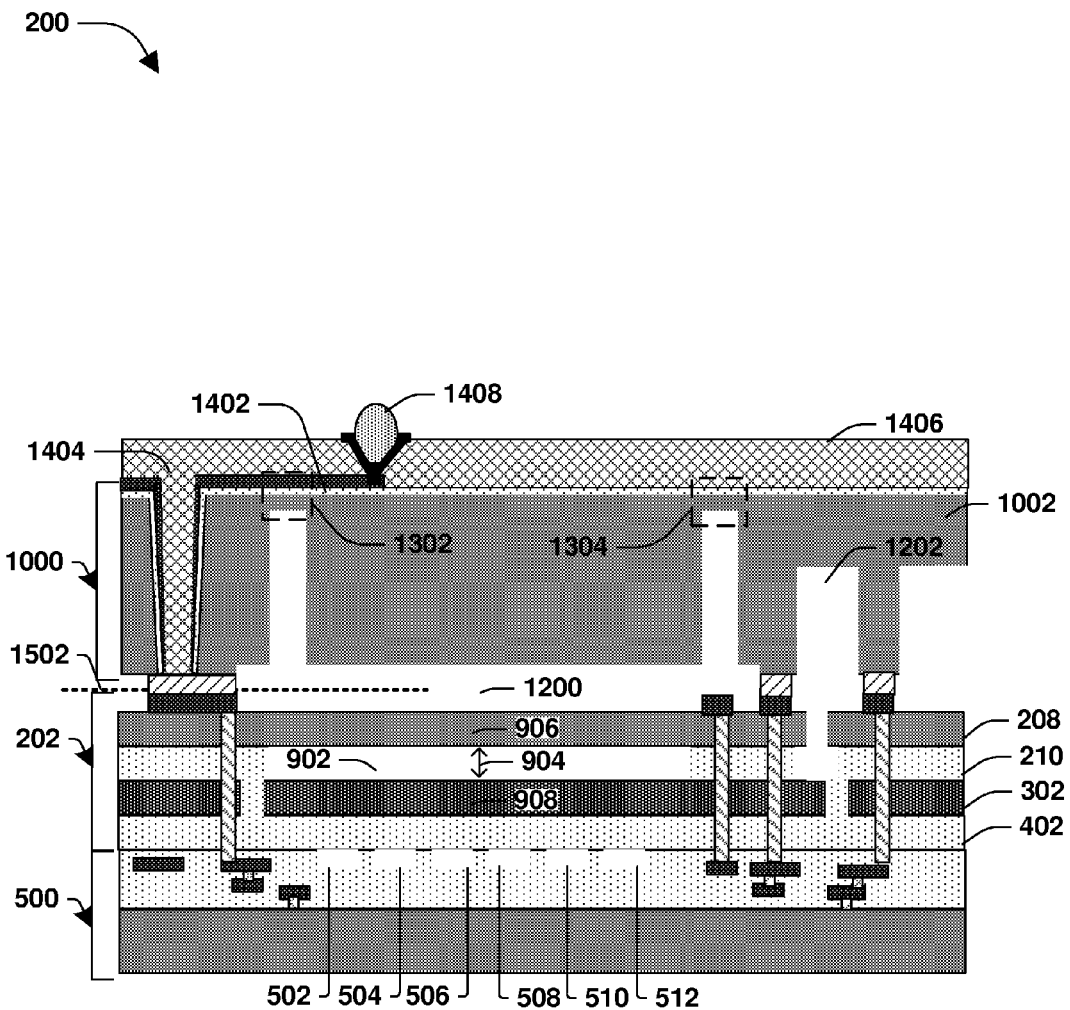
FIG. 15A is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 15B:
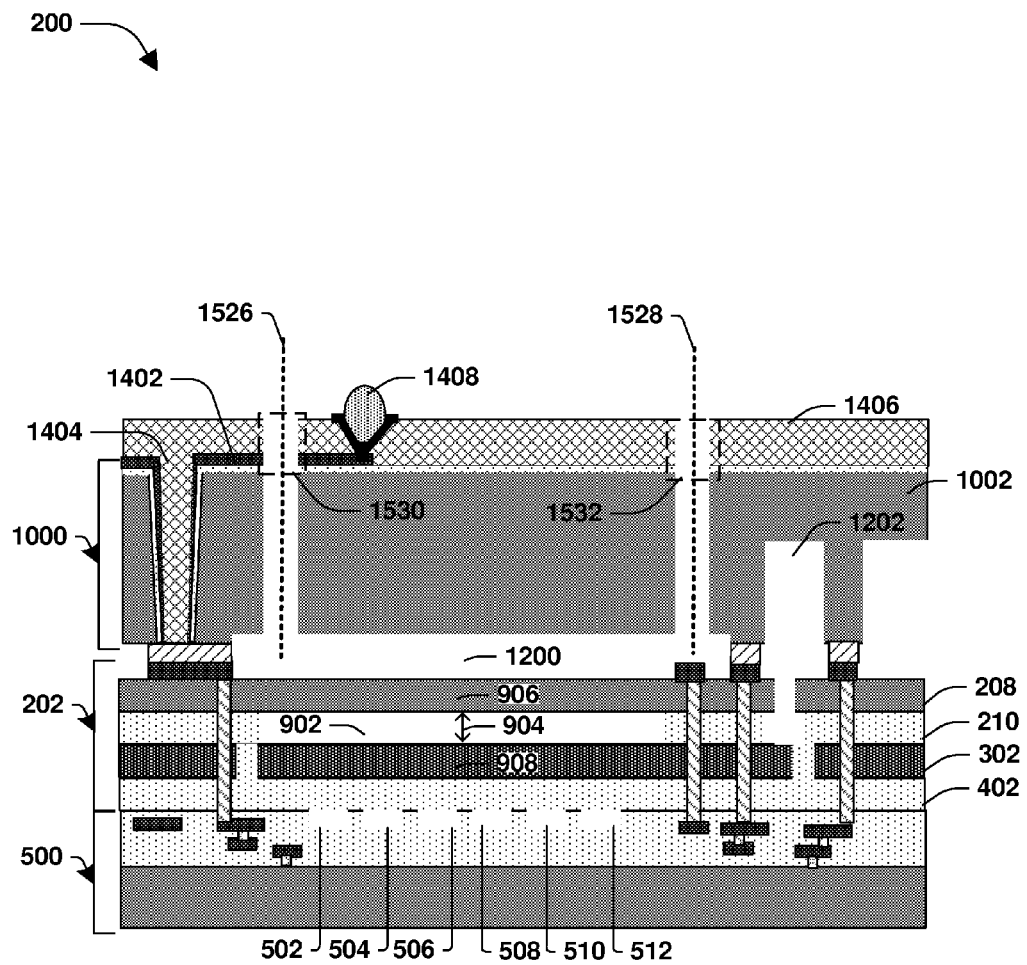
FIG. 15B is an illustration of a semiconductor arrangement comprising a microelectromechanical systems (MEMS) wafer bonded to a complementary metal-oxide-semiconductor (CMOS) wafer and to a cap wafer, in accordance with some embodiments.
Figure 15C:
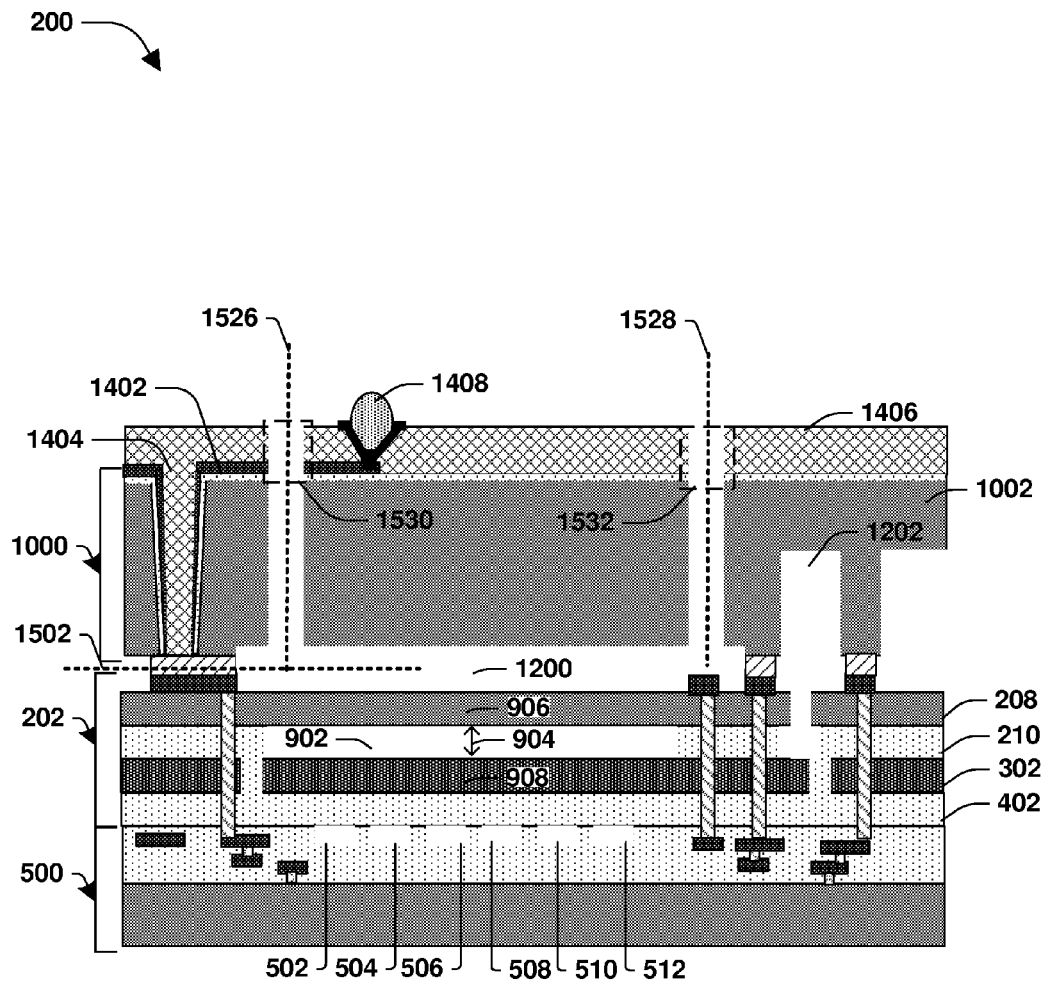
FIG. 15C is an illustration of a semiconductor arrangement comprising a microelectromechanical systems (MEMS) wafer bonded to a complementary metal-oxide-semiconductor (CMOS) wafer and to a cap wafer, in accordance with some embodiments.

In some embodiments, the ambient pressure chamber 1200 is connected to ambient air through an ambient pressure channel 1502, as illustrated in FIG. 15A. In some embodiments, one or more ambient pressure channels, such as a first ambient pressure channel 1526 and a second ambient pressure channel 1528, are formed through the cap wafer 1000 to the ambient pressure chamber 1200, as illustrated in FIG. 15B. The first ambient pressure channel 1526 and the second ambient pressure channel 1528 connect the ambient pressure chamber 1200 to ambient air. In some embodiments, a first membrane spring structure 1530 and a second membrane spring structure 1532 are formed within the cap wafer 1000, such as through the barrier layer 1406. The first membrane spring structure 1530 and the second membrane spring structure 1532 are formed as stress buffers for the semiconductor arrangement 200. In some embodiments, the ambient air chamber 1200 is connected to ambient air through the ambient pressure channel 1502, the first ambient pressure channel 1526, and the second ambient pressure channel 1528, as illustrated in FIG. 15C.

Figure 15D:
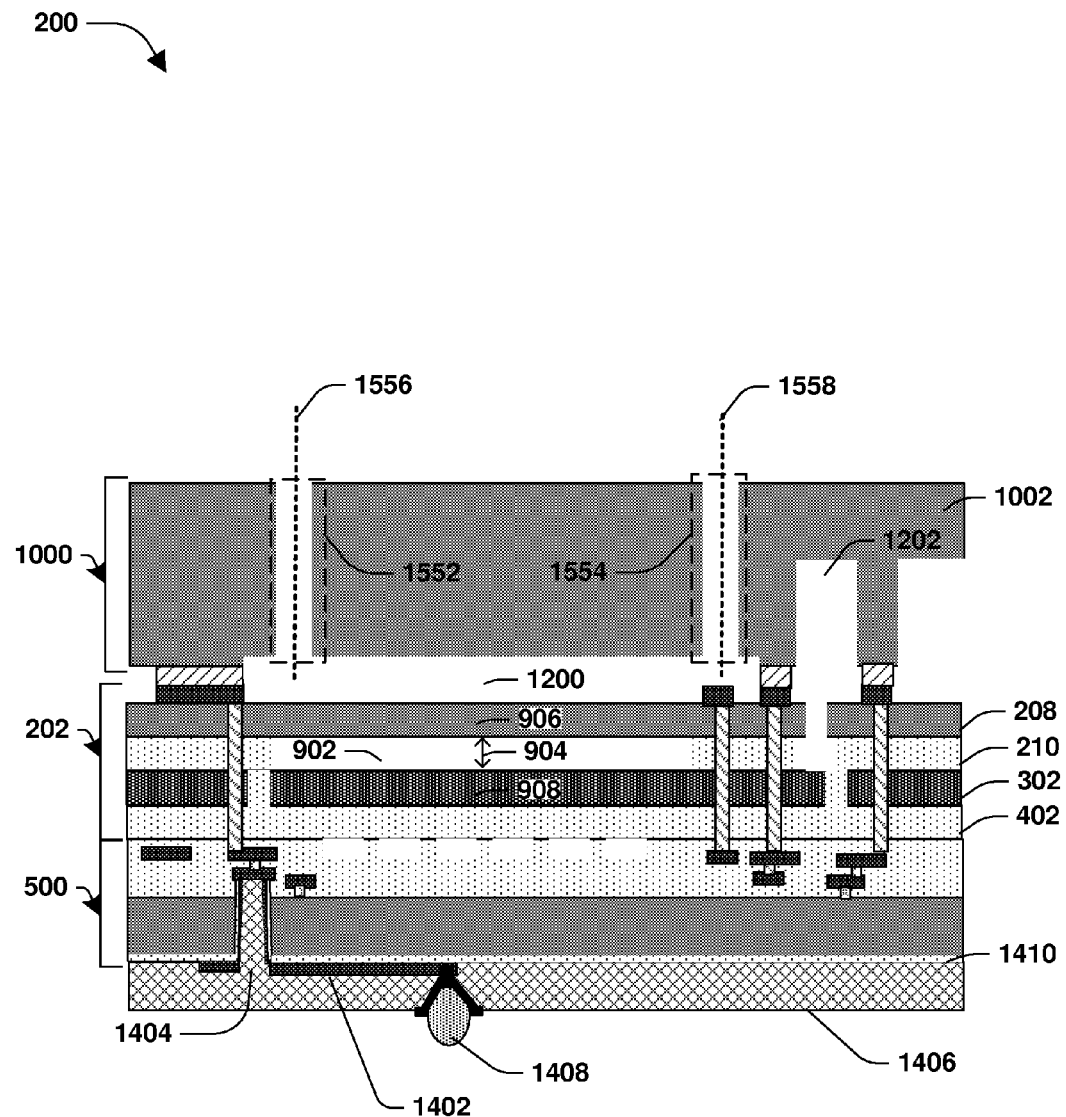
FIG. 15D is an illustration of a semiconductor arrangement comprising a microelectromechanical systems (MEMS) wafer bonded to a complementary metal-oxide-semiconductor (CMOS) wafer and to a cap wafer, in accordance with some embodiments.

In some embodiments, the oxide 1410, the TSV structure 1404, the metal 1402, the metal connection 1408, and the barrier layer 1406 are not formed over the cap wafer 1000, but are instead formed on the CMOS wafer 500, as illustrated in FIG. 15D. The ambient pressure chamber 1200 is connected to ambient air through a first ambient pressure channel 1556 and a second ambient pressure channel 1558 formed through the cap wafer 1000. A first membrane spring structure 1552 and a second membrane spring structure 1554 are formed through the cap wafer 1000 as stress buffers for the semiconductor arrangement 200.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a semiconductor arrangement is provided. The semiconductor arrangement comprises a complementary metal-oxide-semiconductor (CMOS) wafer. The semiconductor arrangement comprises a microelectromehcanimal systems (MEMS) wafer formed over the CMOS wafer. The MEMS wafer comprises a high vacuum chamber configured as a sensing gap between a membrane of the MEMS wafer and a poly layer of the MEMS wafer. The semiconductor arrangement comprises a cap wafer formed over the MEMS wafer. The semiconductor arrangement comprises an ambient pressure chamber formed between the MEMS wafer and the cap wafer.

According to an aspect of the instant disclosure, a semiconductor arrangement is provided. The semiconductor arrangement comprises a complementary metal-oxide-semiconductor (CMOS) wafer. The semiconductor arrangement comprises a microelectromehcanimal systems (MEMS) wafer formed over the CMOS wafer. The MEMS wafer comprises a high vacuum chamber configured as a sensing gap between a membrane of the MEMS wafer and a poly layer of the MEMS wafer. The semiconductor arrangement comprises a cap wafer formed over the MEMS wafer. The cap wafer comprises a first membrane spring structure between a top surface of the cap wafer and an ambient pressure chamber. The ambient pressure chamber is formed between the MEMS wafer and the cap wafer.

According to an aspect of the instant disclosure, a method for forming a semiconductor arrangement is provided. The method comprises forming a complementary metal-oxide-semiconductor (CMOS) wafer. A microelectromehcanimal systems (MEMS) wafer is bonded to the CMOS wafer. The MEMS wafer comprises a high vacuum chamber configured as a sensing gap between a membrane of the MEMS wafer and a poly layer of the MEMS wafer. A cap wafer is bonded to the MEMS wafer. An ambient pressure chamber is formed between the MEMS wafer and the cap wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor arrangement, comprising:
   a complementary metal-oxide-semiconductor (CMOS) wafer;
   a microelectromechanical systems (MEMS) wafer formed over the CMOS wafer, the MEMS wafer comprising a high vacuum chamber configured as a sensing gap between a membrane of the MEMS wafer and a poly layer of the MEMS wafer;
   a cap wafer formed over the MEMS wafer; and
   an ambient pressure chamber formed between the MEMS wafer and the cap wafer.

2. The semiconductor arrangement of claim 1, comprising:
   a thermal insulator structure between the CMOS wafer and the MEMS wafer.

3. The semiconductor arrangement of claim 1, the MEMS wafer comprising:
   an ambient pressure channel connecting the ambient pressure chamber to ambient air.

4. The semiconductor arrangement of claim 1, the cap wafer comprising:
   a first ambient pressure channel connecting the ambient pressure chamber to ambient air, the first ambient pressure channel formed through the cap wafer.

5. The semiconductor arrangement of claim 4, the cap wafer comprising:
   a second ambient pressure channel connecting the ambient pressure chamber to ambient air, the second ambient pressure channel formed through the cap wafer.

6. The semiconductor arrangement of claim 1, the cap wafer comprising:
   a first membrane spring structure formed between a top surface of the cap wafer and the ambient pressure chamber.

7. The semiconductor arrangement of claim 6, the cap wafer comprising:
   a second membrane spring structure formed between the top surface of the cap wafer and the ambient pressure chamber.

8. The semiconductor arrangement of claim 1, comprising:
   a vacuum chamber formed between the cap wafer and the MEMS wafer.

9. The semiconductor arrangement of claim 1, comprising:
   a barrier layer formed over the cap wafer.

10. The semiconductor arrangement of claim 9, comprising
    a first spring structure formed through the barrier layer.

11. The semiconductor arrangement of claim 9, comprising
    a second spring structure formed through the barrier layer.

12. The semiconductor arrangement of claim 1, the sensing gap formed between a first sensing plate coupled to the membrane and a second sensing plate coupled to the poly layer.

13. The semiconductor arrangement of claim 12, the first sensing plate and the second sensing plate configured to provide capacitance information used to determine deformation of the sensing gap.

14. The semiconductor arrangement of claim 1, the cap wafer comprising a through-silicon via (TSV).

15. A semiconductor arrangement, comprising:
    a complementary metal-oxide-semiconductor (CMOS) wafer;
    a microelectromechanical systems (MEMS) wafer formed over the CMOS wafer, the MEMS wafer comprising a high vacuum chamber configured as a sensing gap between a membrane of the MEMS wafer and a poly layer of the MEMS wafer; and
    a cap wafer formed over the MEMS wafer, the cap wafer comprising a first membrane spring structure between a top surface of the cap wafer and an ambient pressure chamber, the ambient pressure chamber formed between the MEMS wafer and the cap wafer.

16. The semiconductor arrangement of claim 15, the cap wafer comprising:
 a second membrane spring structure between the top surface of the cap wafer and the ambient pressure chamber.

17. The semiconductor arrangement of claim 15, comprising:
 a barrier layer formed below the CMOS wafer.

18. The semiconductor arrangement of claim 17, the barrier layer comprising a polybenzoxazole material.

19. A method for forming a semiconductor arrangement, comprising:
 forming a microelectromechanical systems (MEMS) wafer comprising a high vacuum chamber configured as a sensing gap between a membrane of the MEMS wafer and a poly layer of the MEMS wafer;
 bonding a complementary metal-oxide-semiconductor (CMOS) wafer to the MEMS wafer;
 bonding a cap wafer to the MEMS wafer; and
 forming an ambient pressure chamber between the MEMS wafer and the cap wafer.

20. The method of claim 19, comprising:
 forming a spring structure within or above the cap wafer.

\* \* \* \* \*